US009224468B2

(12) United States Patent  
Lee

(10) Patent No.: US 9,224,468 B2  
(45) Date of Patent: Dec. 29, 2015

(54) RESISTIVE MEMORY AND ASSOCIATED OPERATION METHOD

(71) Applicant: Macronix International Co., Ltd., Hsinchu (TW)

(72) Inventor: Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 22 days.

(21) Appl. No.: 14/272,533

(22) Filed: May 8, 2014

(65) Prior Publication Data

US 2015/0325294 A1    Nov. 12, 2015

(51) Int. Cl.  
*G11C 11/00* (2006.01)  
*G11C 13/00* (2006.01)

(52) U.S. Cl.  
CPC .......... *G11C 13/0069* (2013.01); *G11C 13/003* (2013.01); *G11C 13/004* (2013.01); *G11C 13/0004* (2013.01); *G11C 13/0007* (2013.01); *G11C 13/0097* (2013.01); *G11C 13/0011* (2013.01)

(58) Field of Classification Search  
CPC ........... G11C 13/0069; G11C 13/0004; G11C 13/0007; G11C 13/004; G11C 13/0011  
USPC .................................. 365/148, 163, 94, 100  
See application file for complete search history.

(56) References Cited

U.S. PATENT DOCUMENTS

| | | | | |
|---|---|---|---|---|
| 7,859,882 B2* | 12/2010 | Cho et al. | ...................... | 365/148 |
| 8,681,529 B2* | 3/2014 | Liu et al. | ........................ | 365/148 |
| 2009/0257264 A1* | 10/2009 | Hoenigschmid | .............. | 365/148 |
| 2012/0020140 A1* | 1/2012 | Chen | ............................. | 365/148 |
| 2012/0044742 A1* | 2/2012 | Narayanan | .................... | 365/148 |

* cited by examiner

*Primary Examiner* — Pho M Luu  
(74) *Attorney, Agent, or Firm* — McClure, Qualey & Rodack, LLP

(57) ABSTRACT

A resistive memory includes a resistive memory cell, a main transistor and an auxiliary transistor. The drain of the main transistor and the drain of the auxiliary transistor are coupled to one end of the resistive memory cell. When the resistive memory cell is programmed, the main transistor is turned on and the auxiliary transistor is turned off. When the resistive memory cell is erased, the main transistor and the auxiliary transistor are turned on.

18 Claims, 13 Drawing Sheets

11

RESISTIVE MEMORY AND ASSOCIATED OPERATION METHOD

BACKGROUND OF THE INVENTION

1. Field of the Invention

The invention relates in general to a memory, and more particularly to a resistive memory and an associated operation method.

2. Description of the Related Art

FIG. 14 shows a schematic diagram of programming a conventional resistive memory. FIG. 15 shows a schematic diagram of erasing a conventional resistive memory. A fundamental structure of a conventional resistive memory 3 is formed by a transistor T and a resistive memory cell $R_{cell}$. The resistive memory 3 is a metal/insulation layer/metal (MIM) structure. By changing the resistance of the resistive memory cell $R_{cell}$, the resistive memory 3 performs programming and erasing operations.

As shown in FIG. 14, when programming the resistive memory cell $R_{cell}$, a bias voltage +V is applied to the gate of the transistor T and the resistive memory cell $R_{cell}$, and the source of the transistor T is grounded. (i.e., coupled to 0V), such that the transistor T is turned on. A programming current $I_p$ flows from the resistive memory cell $R_{cell}$ to the transistor T. That is, the programming current $I_p$ flows from the drain of the transistor T to the source of the transistor T.

As shown in FIG. 15, when the resistive memory cell $R_{cell}$ is erased, a bias voltage +V is applied to the gate of the transistor T and the source of the transistor T, and the resistive memory cell $R_{cell}$ is grounded, such that the transistor T is turned on. An erasing current $I_r$ flows from the transistor T to the resistive memory cell $R_{cell}$. That is, the erasing current $I_r$ flows from the source of the transistor T to the drain of the transistor T. However, when erasing a conventional resistive memory, a body effect of a transistor causes an erasing current $I_r$ to drop, which affects operation efficiency of the conventional resistive memory and may easily lead to an erase failure.

SUMMARY OF THE INVENTION

The invention is directed to a resistive memory and an associated operation method.

A resistive memory is provided by the present invention. The resistive memory includes a resistive memory cell, a main transistor and an auxiliary transistor. The drain of the main transistor and the drain of the auxiliary transistor are coupled to one end of the resistive memory cell. When the resistive memory cell is programmed, the main transistor is turned on and the auxiliary transistor is turned off. When the resistive memory is erased, the main transistor and the auxiliary transistor are turned on.

An operation method of a resistive memory is provided by the present invention. The resistive memory includes a resistive memory cell, a main transistor and an auxiliary transistor. The operation method includes: when the resistive memory cell is programmed, turning on the main transistor coupled to the resistive memory cell, and turning off the auxiliary transistor coupled to the resistive memory cell and the transistor; and when the resistive memory cell is erased, turning on the main transistor and the auxiliary transistor.

The above and other aspects of the invention will become better understood with regard to the following detailed description of the preferred but non-limiting embodiments. The following description is made with reference to the accompanying drawings.

DETAILED DESCRIPTION OF THE INVENTION

First Embodiment

Figure 1:
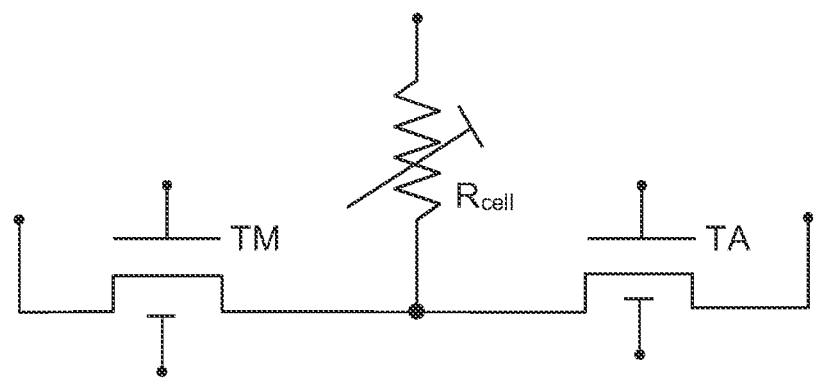
FIG. 1 is a schematic diagram of a memory unit of a resistive memory according to a first embodiment.
Figure 2:
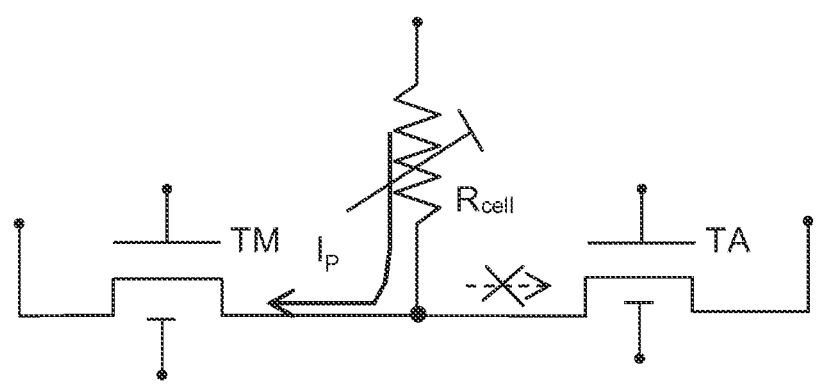
FIG. 2 is a schematic diagram of programming a resistive memory cell.
Figure 3:
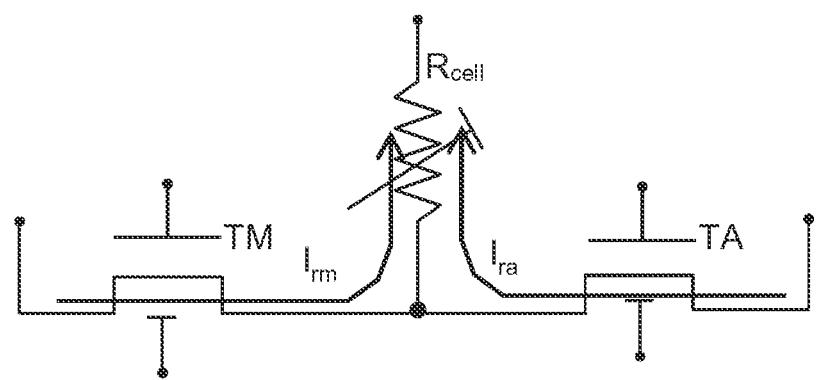
FIG. 3 is a schematic diagram of erasing a resistive memory cell.

Referring to FIGS. 1, 2 and 3, FIG. 1 shows a schematic diagram of a memory unit of a resistive memory according to a first embodiment, FIG. 2 shows a schematic diagram of programming a resistive memory cell, and FIG. 3 shows a schematic diagram of erasing a resistive memory cell. A memory unit 11 includes a resistive memory cell $R_{cell}$, a main transistor TM and an auxiliary memory TA. The drain of the main transistor TM and the drain of the auxiliary transistor TA are coupled to one end of the resistive memory cell $R_{cell}$, which has the other end coupled to a corresponding drain line. The gate of the main transistor TM is coupled to a corresponding main gate line, and the gate of the auxiliary transistor TA is coupled to a corresponding auxiliary gate line. A gate voltage applied to the main gate line may be adjusted according to a position of the main gate line. Similarly, a gate voltage applied to the auxiliary gate line may be adjusted according to a position of the auxiliary gate line. The source of the main transistor TM is coupled to a corresponding source line, and the source of the auxiliary transistor TA is coupled to a corresponding source line.

As shown in FIG. 2, when the resistive memory cell $R_{cell}$ is programmed, the main transistor TM is turned on and the auxiliary transistor TA is turned off. A programming current $I_p$ flows from the resistive memory cell $R_{cell}$ to the main transistor TM. As shown in FIG. 3, when the resistive memory cell $R_{cell}$ is erased, the main transistor TM and the auxiliary transistor TA are turned on. An erasing current $I_{rm}$ flows from the main transistor TM to the resistive memory cell $R_{cell}$, and an erasing current $I_{ra}$ flows from the auxiliary transistor TA to the resistive memory cell $R_{cell}$. As such, a total of the erasing current flowing through the resistive memory cell $R_{cell}$ can be increased to compensate the body effect of the transistors. Further, when the resistive memory cell $R_{cell}$ is accessed, the main transistor TM is turned on and the auxiliary transistor TA is turned off. Alternatively, when the resistive memory cell $R_{cell}$ is accessed, the main transistor TM is turned on and the auxiliary transistor TA is turned on.

Figure 4:
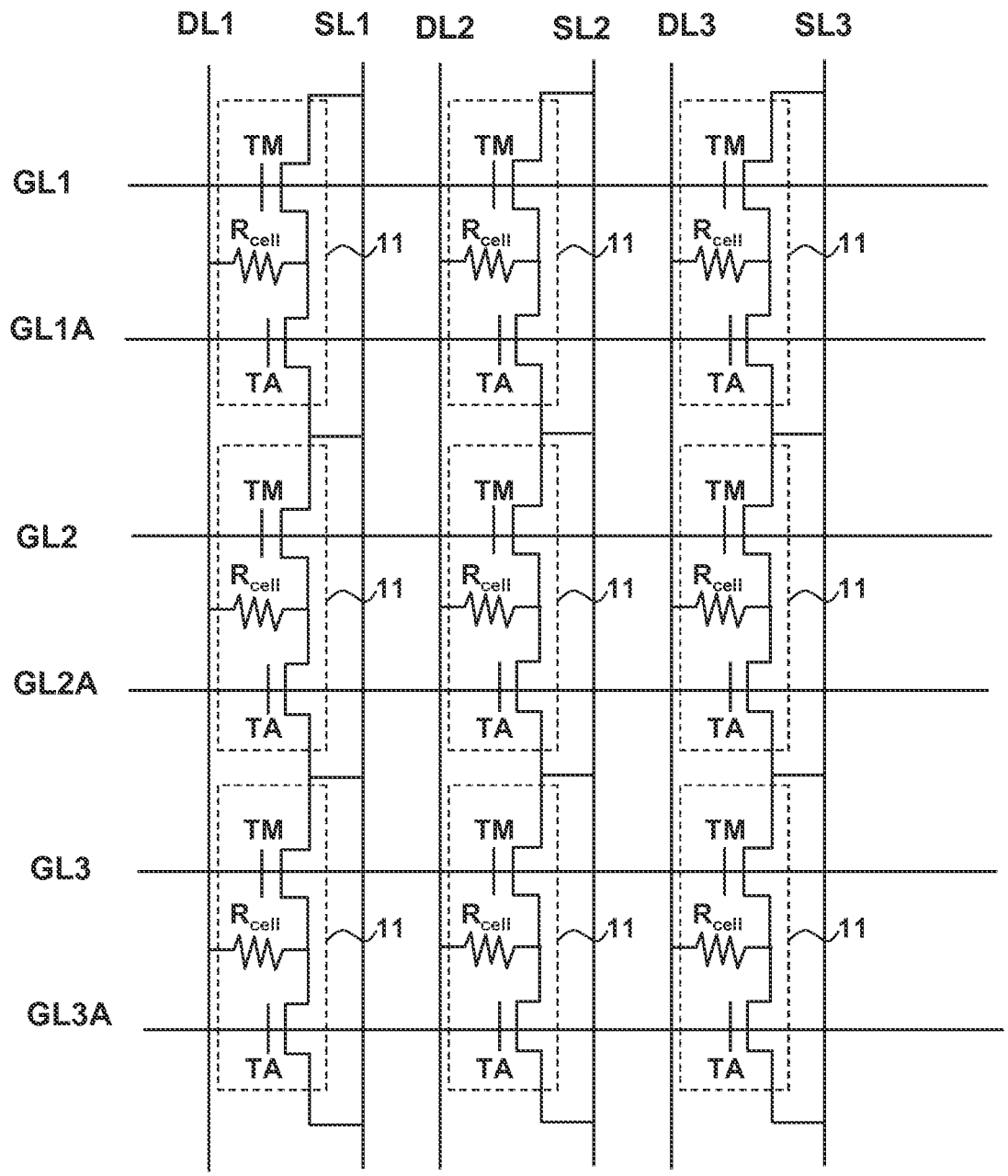
FIG. 4 is a circuit diagram of a resistive memory according to the first embodiment.
Figure 5:
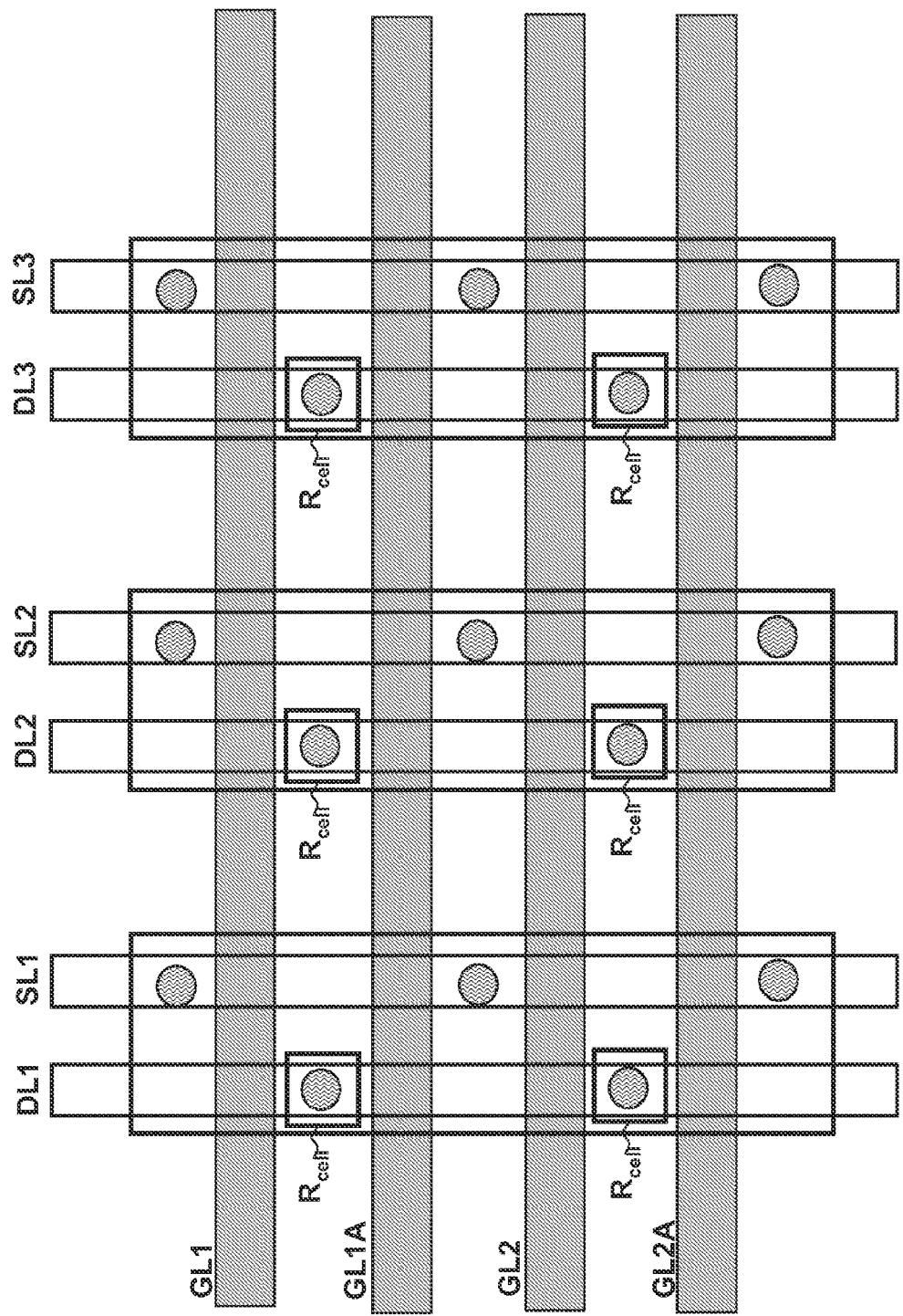
FIG. 5 is a circuit layout diagram of a resistive memory according to the first embodiment.

Referring to FIG. 4 and FIG. 5, FIG. 4 shows a circuit diagram of a resistive memory according to a first embodiment of the present invention, and FIG. 5 shows a circuit layout diagram of a resistive memory according to the first embodiment of the present invention. The foregoing drain line is exemplified by drain lines DL1 to DL3 in FIG. 4, and the foregoing source line is exemplified by source lines SL1 to SL3 in FIG. 4. The foregoing main gate line is exemplified by main gate lines GL1 to GL3 in FIG. 4, and the foregoing auxiliary gate line is exemplified by auxiliary gate lines GLA1 to GLA3 in FIG. 4. A resistive memory 1 includes memory units 11, the drain lines DL1 to DL3, the main gate lines GL1 to GL3, the auxiliary gate lines GLA1 to GL3A, and the source lines SL1 to SL3. The drain lines DL1 to DL3, the main gate lines GL1 to GL3, the auxiliary gate lines GL1A to GL3A, and the source lines SL1 to SL3 are coupled to the corresponding memory units 11. The drain lines DL1 to DL3 are parallel to the source lines SL1 to SL3, and are perpendicular to the main gate lines GL1 to GL3 and the auxiliary gate lines GL1A to GL3A.

Figure 6:
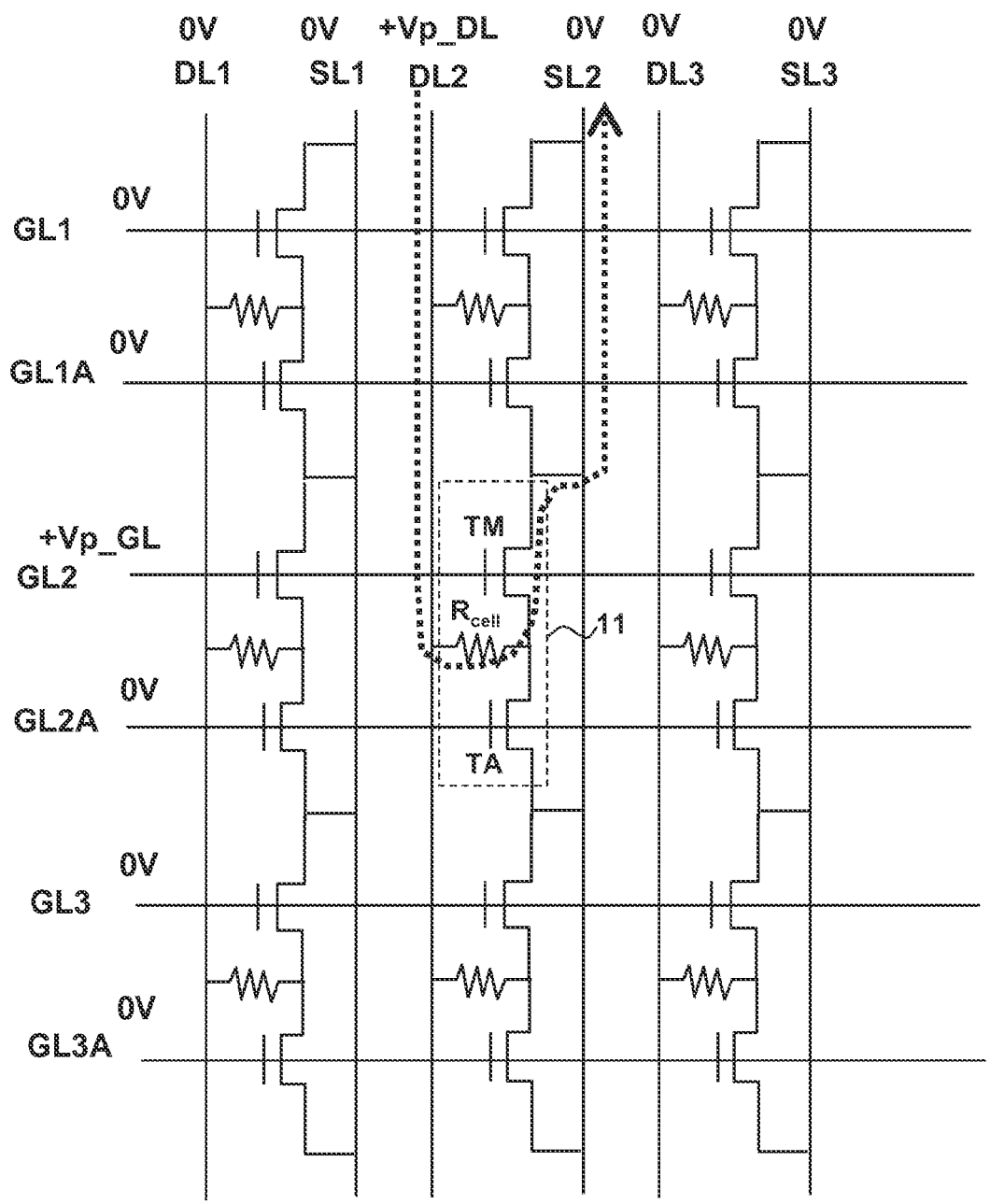
FIG. 6 is a schematic diagram of programming a resistive memory according to the first embodiment.

Referring to FIG. 6 and Table-1, FIG. 6 shows a schematic diagram of programming a resistive memory according to the first embodiment, and Table-1 shows corresponding voltage levels of the source lines, drain lines, main gate lines and auxiliary gate lines when the resistive memory is programmed, erased and accessed.

TABLE 1

|  | Programmed | Erased | Accessed |
|---|---|---|---|
| Selected drain line | +Vp_DL | 0 | +Vr_DL |
| Selected source line | 0 | +Ve_SL | 0 |
| Selected main gate line | +Vp_GL | +Ve_GL | +Vr_GL |
| Selected auxiliary gate line | 0 | +Ve_GL | 0 or +Vr_GL |
| Unselected drain line | 0 | 0 | 0 |
| Unselected source line | 0 | 0 | 0 |
| Unselected main gate line | 0 | 0 | 0 |
| Unselected auxiliary gate line | 0 | 0 | 0 |
| Transistor body (Well) | 0 | 0 | 0 |

When the memory unit 11 coupled to the drain line DL2, the source line SL2, the main gate line GL2 and the auxiliary gate line GL2A is selected, and the resistive memory cell $R_{cell}$ of the selected memory unit 11 is programmed, the drain line DL2, the source line SL2, the main gate line GL2 and the auxiliary gate line GL2A are as shown in Table-1. The drain line DL2 is applied with a drain bias voltage +Vp_DL, the main gate line GL2 is applied with a gate bias voltage +Vp_GL, and the source line SL2 and the auxiliary gate line GL2A are grounded (i.e., 0V). The gate bias voltage +Vp_GL is adjustable according to a position of the main gate line GL2. The unselected drain lines (e.g., the drain lines DL1 and DL3), the unselected source lines (e.g, the source lines SL1 and SL3), the unselected main gate lines (e.g., the main gate lines GL1 and GL3), the unselected auxiliary gate lines (e.g., the auxiliary gate lines GL1A and GL3A), and the transistor body (or the well) are grounded.

Figure 7:
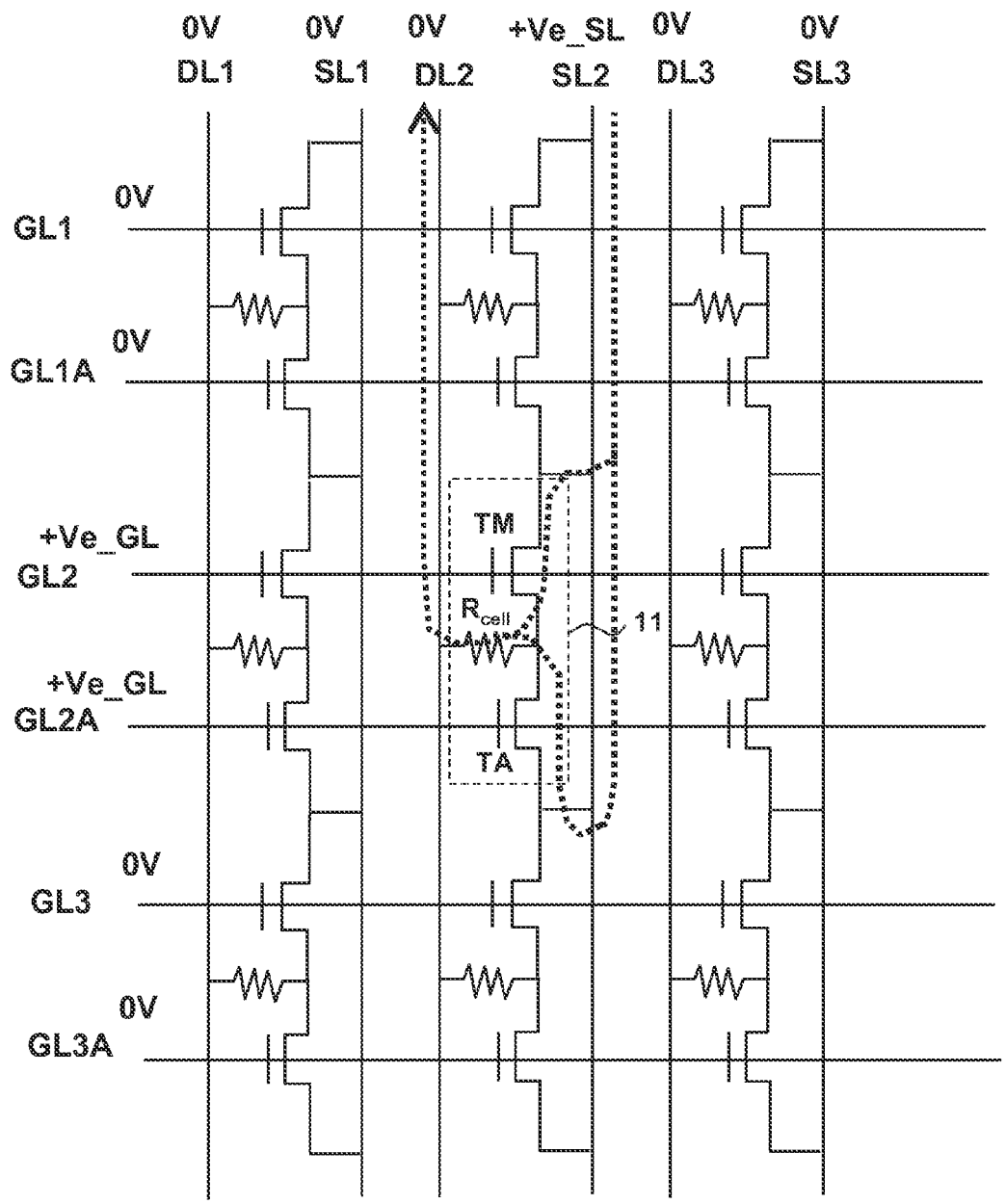
FIG. 7 is a schematic diagram of erasing a resistive memory according to the first embodiment.

Referring to FIG. 7 and Table-1, FIG. 7 shows a schematic diagram of erasing a resistive memory according to the first embodiment. When the memory unit 11 coupled to the drain line DL2, the source line SL2, the main gate line GL2 and the auxiliary gate line GL2A is selected, and the resistive memory cell $R_{cell}$ of the selected memory unit 11 is erased, the drain line DL2, the source line SL2, the main gate line GL2 and the auxiliary gate line GL2A are as shown in Table-1. The drain line DL2 is grounded, the source line SL2 is applied with a source bias voltage +Ve_SL, and the main gate line GL2 and the auxiliary gate line GL2A are applied with the gate bias voltage +Ve_GL. The gate bias voltage +Ve_GL is adjustable according to the positions of the main gate line GL2 and the auxiliary gate line GL2A. The unselected drain lines (e.g., the drain lines DL1 and DL3), the unselected source lines (e.g., the source lines SL1 and SL3), the unselected main gate lines (e.g., the main gate lines GL1 and GL3), the unselected auxiliary gate lines (e.g., the auxiliary gate lines GL1A and GL3A), and the transistor body are grounded.

Figure 8:
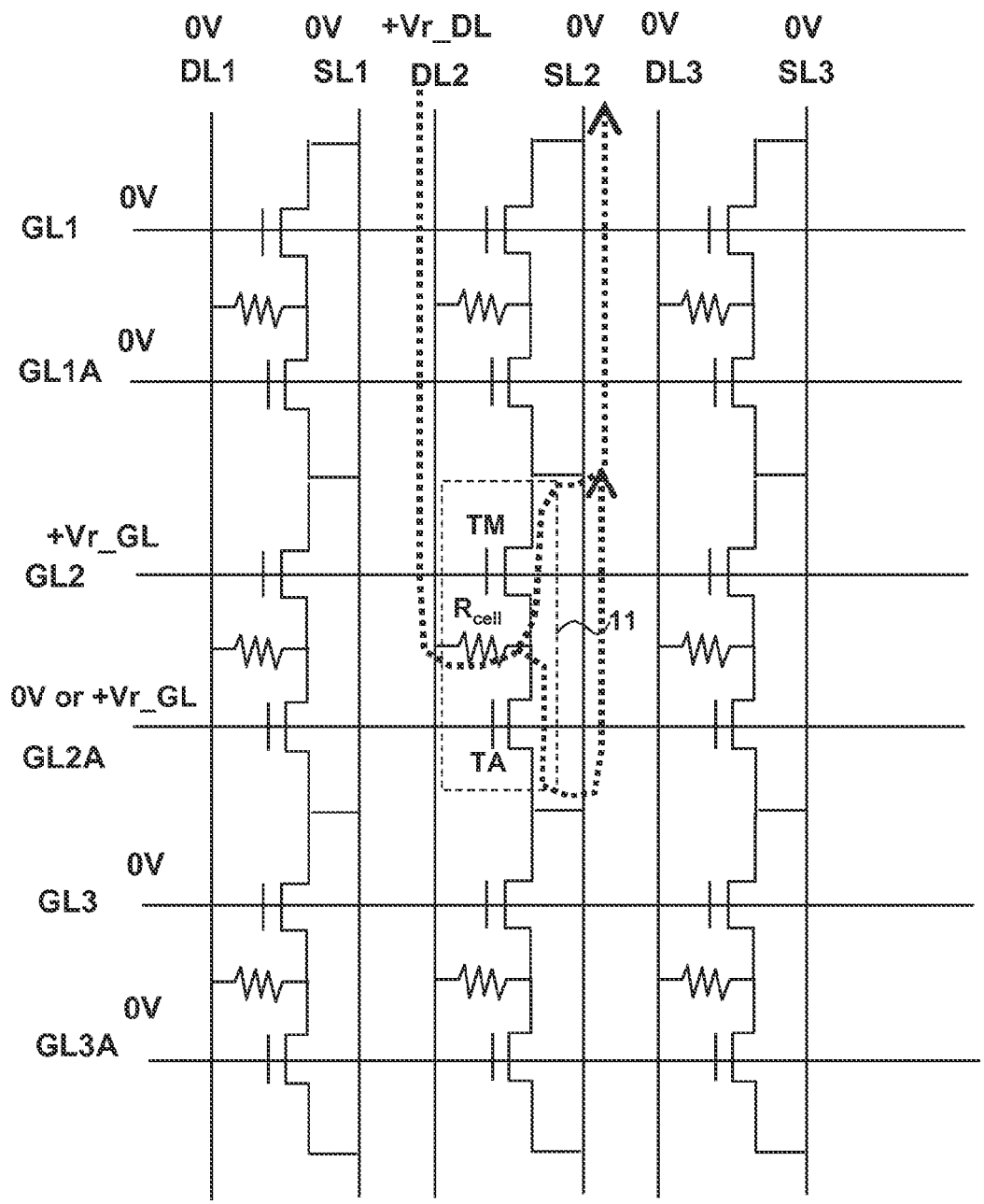
FIG. 8 is a schematic diagram of accessing a resistive memory according to the first embodiment.

Referring to FIG. 8 and Table-1, FIG. 8 shows a schematic diagram of accessing a resistive memory according to the first embodiment. When the memory unit 11 coupled to the drain line DL2, the source line SL2, the main gate line GL2 and the auxiliary gate line GL2A is selected, and the resistive memory cell $R_{cell}$ of the selected memory unit is accessed, the drain line DL2, the source line SL2, the main gate line GL2 and the auxiliary gate line GL2A are as shown in Table-1. The drain line DL2 is applied with a drain voltage +Vr_DL, the source line SL2 is grounded, the main gate line GL2 is applied with the gate bias voltage +Vr_GL, and the auxiliary gate line GL2A is grounded or applied with the gate bias voltage +Vr_GL. The gate bias voltage +Vr_GL is adjustable according to the position of the main gate line GL2. The unselected drain lines (e.g., the drain lines DL1 and DL3), the unselected source lines (e.g., the source lines SL1 and SL3), the unselected main gate lines (e.g., the main gate lines GL1 and GL3), the unselected auxiliary gate lines (e.g., the auxiliary gate lines GL1A and GL3A), and the transistor body are grounded.

Second Embodiment

Figure 9:
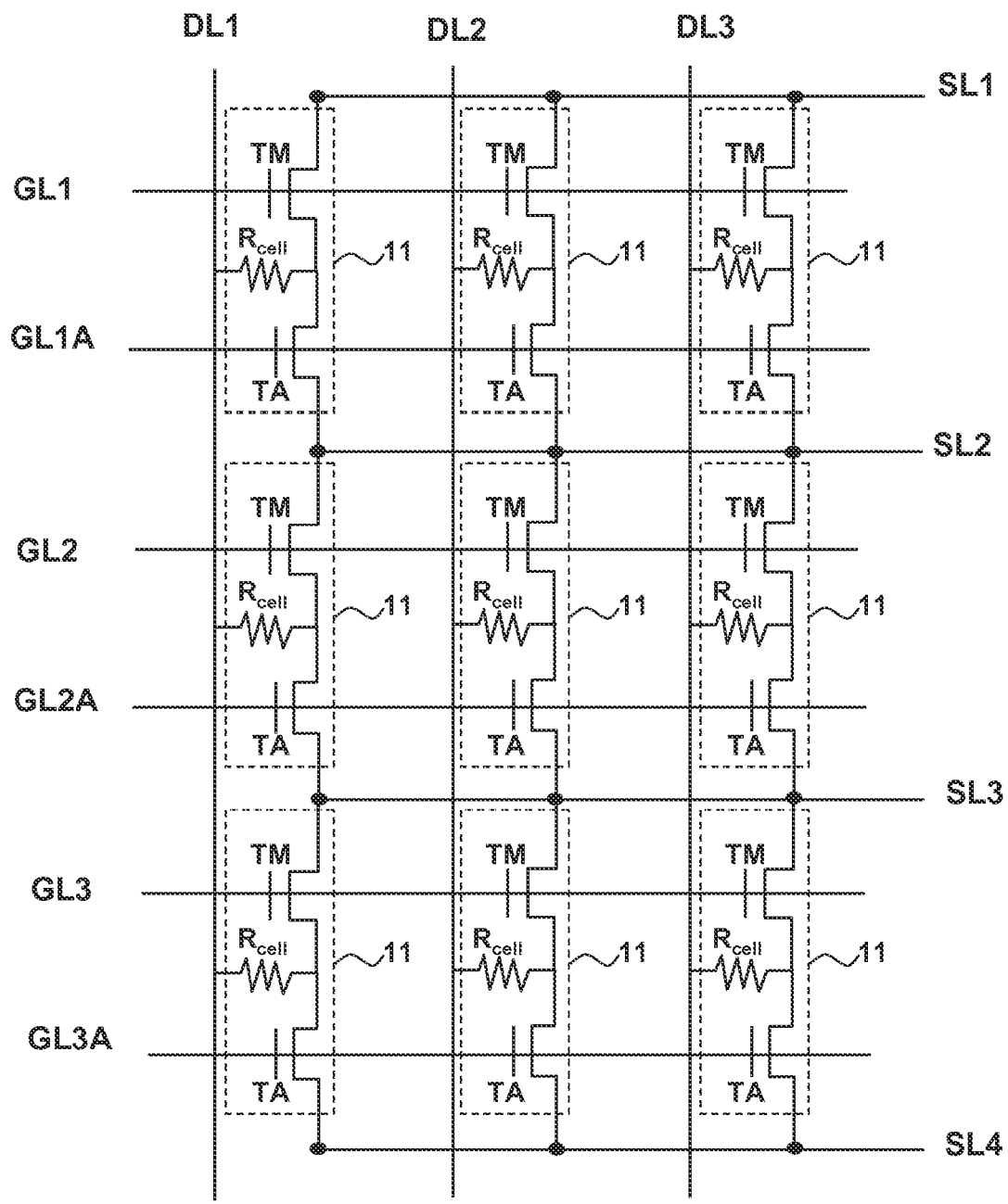
FIG. 9 is a circuit diagram of a resistive memory according to a second embodiment.
Figure 10:
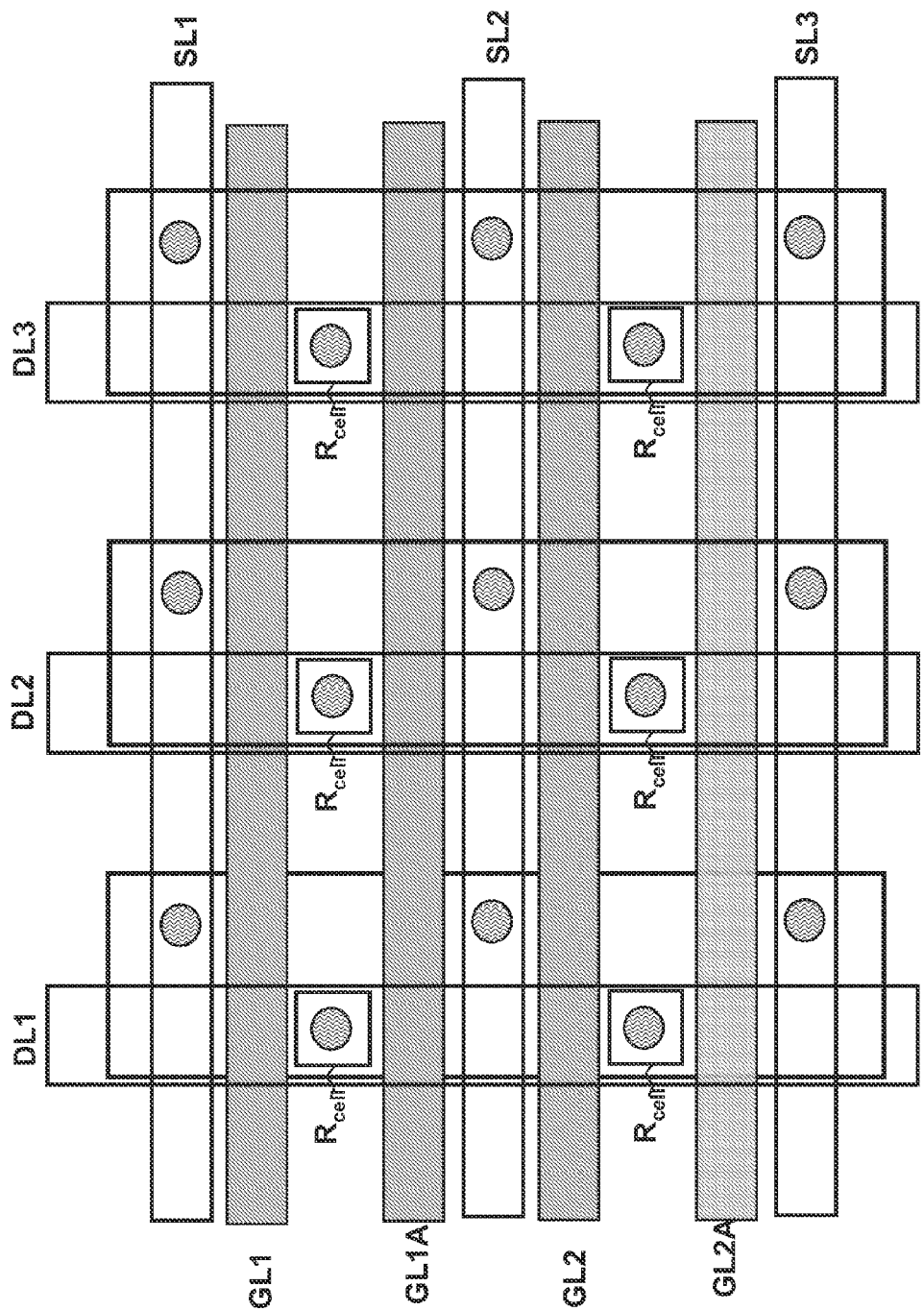
FIG. 10 is a circuit layout diagram of a resistive memory according to the second embodiment.

Referring to FIG. 9 and FIG. 10, FIG. 9 shows a circuit diagram of a resistive memory according to a second embodiment, and FIG. 10 shows a circuit layout diagram of a resistive memory according to the second embodiment. The foregoing drain line is exemplified by drain lines DL1 to DL3 in FIG. 9, and the foregoing source line is exemplified by source lines SL1 to SL4 in FIG. 9. The foregoing main gate line is exemplified by main gate lines GL1 to GL3 in FIG. 9, and the foregoing auxiliary gate line is exemplified by auxiliary gate lines GLA1 to GLA3 in FIG. 9. A resistive memory 2 includes memory units 11, the drain lines DL1 to DL3, the main gate lines GL1 to GL3, the auxiliary gate lines GLA1 to GL3A, and the source lines SL1 to SL4. The drain lines DL1 to DL3, the main gate lines GL1 to GL3, the auxiliary gate lines GL1A to GL3A, and the source lines SL1 to SL4 are coupled to the corresponding memory units 11. The drain lines DL1 to DL3 are perpendicular to the source lines SL1 to SL4, the main gate lines GL1 to GL3 and the auxiliary gate lines GL1A to GL3A.

Figure 11:
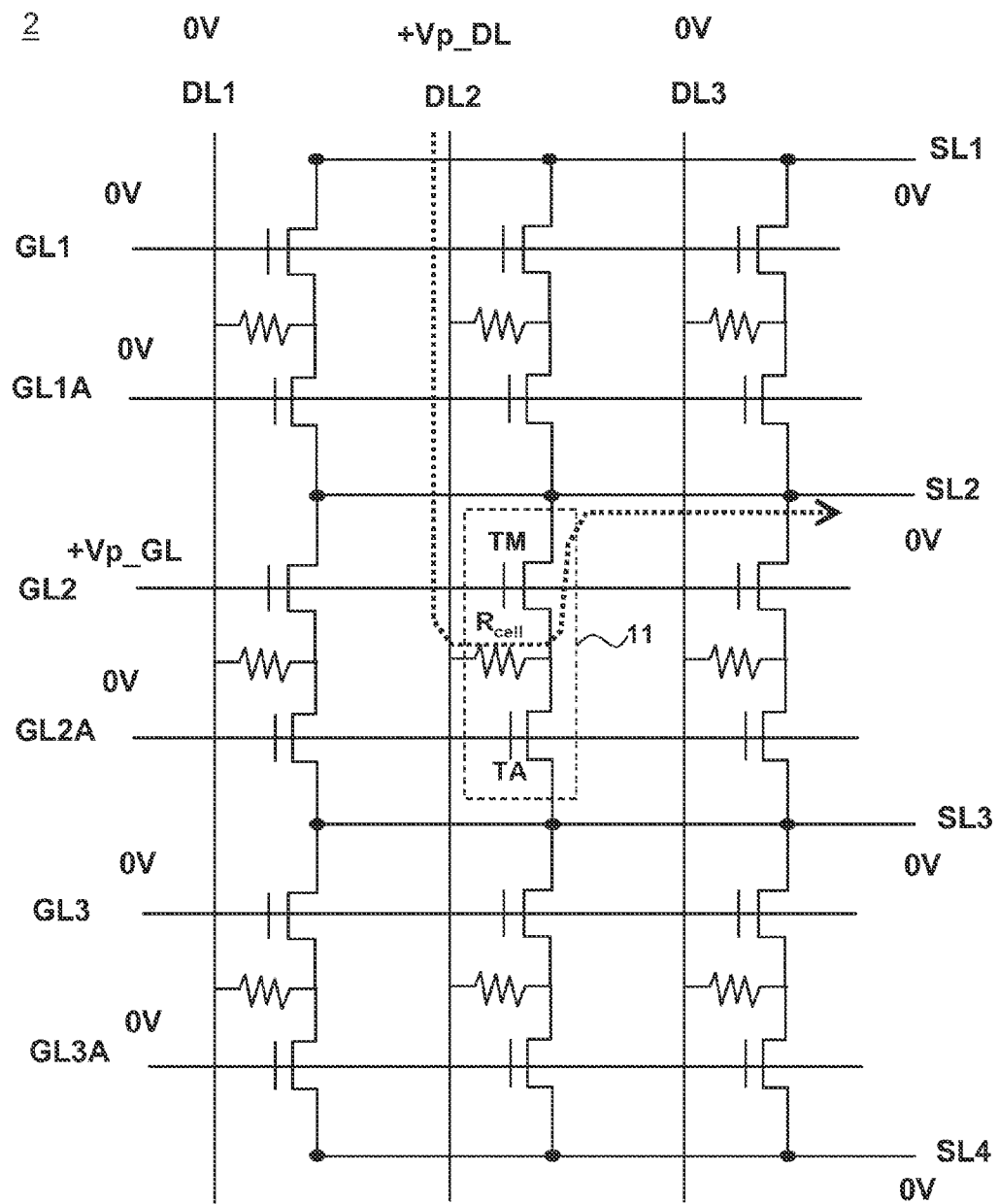
FIG. 11 is a schematic diagram of programming a resistive memory according to the second embodiment.

Referring to FIG. 11 and Table-2, FIG. 11 shows a schematic diagram of programming a resistive memory according to the second embodiment, and Table-2 shows corresponding voltage levels of source lines, drain lines, main gate lines and auxiliary gate lines when the resistive memory is programmed, erased and accessed.

TABLE 2

| | Programmed | Erased | Accessed |
|---|---|---|---|
| Selected drain line | +Vp_DL | 0 | +Vr_DL |
| Selected $N^{th}$ source line | 0 | +Ve_SL | 0 |
| Selected $(N+1)^{th}$ source line | 0 | +Ve_SL | 0 |
| Selected main gate line | +Vp_GL | +Ve_GL | +Vr_GL |
| Selected auxiliary gate line | 0 | +Ve_GL | 0 or +Vr_GL |
| Unselected drain line | 0 | +Ve_SL | 0 |
| Unselected source line | 0 | 0 | 0 |
| Unselected main gate line | 0 | 0 | 0 |
| Unselected auxiliary gate line | 0 | 0 | 0 |
| Transistor body (Well) | 0 | 0 | 0 |

When the memory unit 11 coupled to the drain line DL2, the source line SL2, the source line SL3, the main gate line GL2 and the auxiliary gate line GL2A is selected, and the resistive memory cell $R_{cell}$ of the selected memory unit 11 is programmed, the drain line DL2, the source line SL2, the source line SL3, the main gate line GL2 and the auxiliary gate line GL2A are as shown in Table-2. The drain line DL2 is applied with a drain bias voltage +Vp_DL, the main gate line GL2 is applied with a gate bias voltage +Vp_GL, and the source line SL2, the source line SL3 and the auxiliary gate line GL2A are grounded (i.e., 0V). The gate bias voltage +Vp_GL is adjustable according to a position of the main gate line GL2. The unselected drain lines (e.g., the drain lines DL1 and DL3), the unselected source lines (e.g, the source lines SL1 and SL4), the unselected main gate lines (e.g., the main gate lines GL1 and GL3), the unselected auxiliary gate lines (e.g., the auxiliary gate lines GL1A and GL3A), and the transistor body are grounded.

Figure 12:
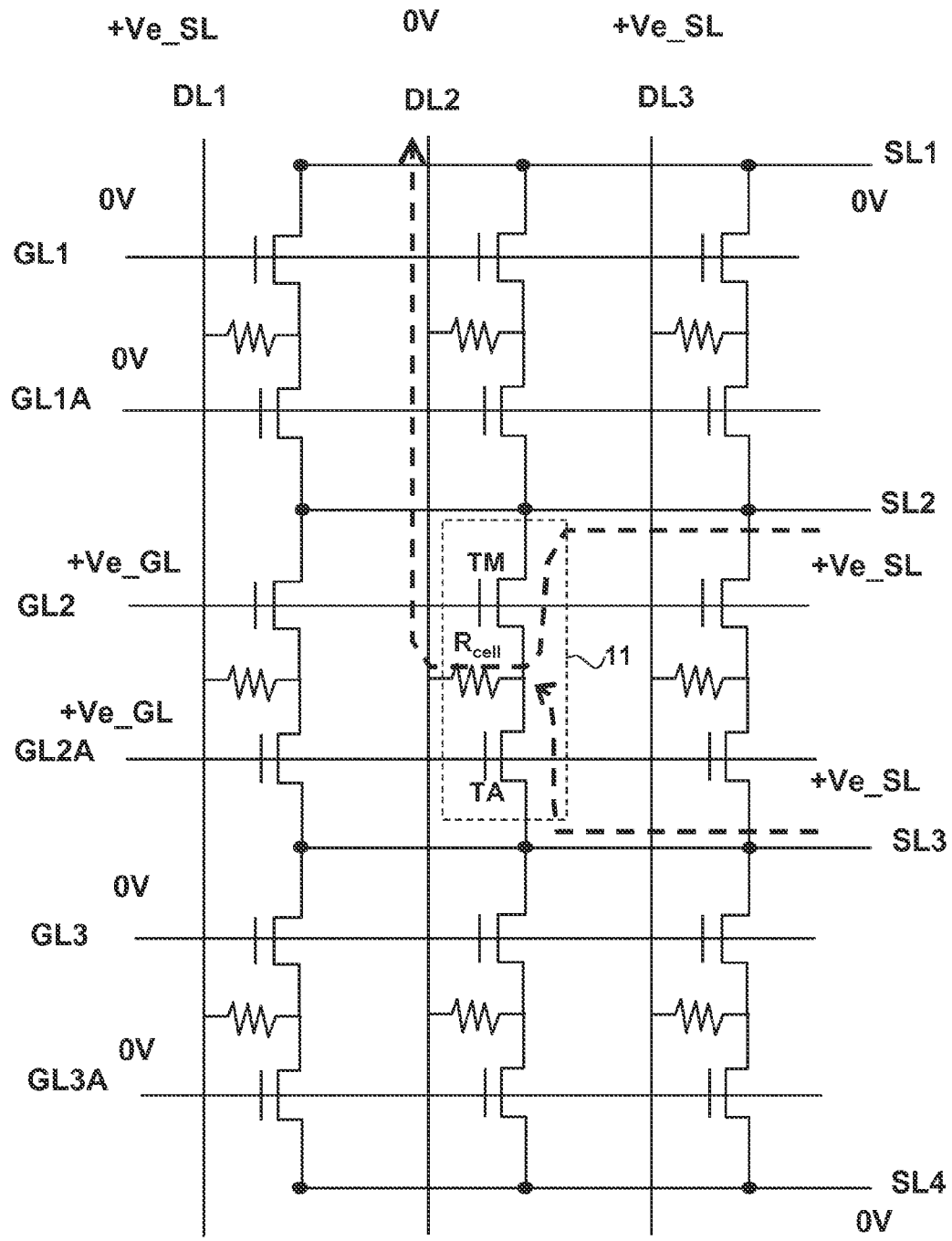
FIG. 12 is a schematic diagram of erasing a resistive memory according to the second embodiment.

Referring to FIG. 12 and Table-2, FIG. 12 shows a schematic diagram of erasing a resistive memory according to the second embodiment. When the memory unit 11 coupled to the drain line DL2, the source line SL2, the source line SL3, the main gate line GL2 and the auxiliary gate line GL2A is selected, and the resistive memory cell $R_{cell}$ of the selected memory unit 11 is erased, the drain line DL2, the source line SL2, the source line SL3, the main gate line GL2 and the auxiliary gate line GL2A are as shown in Table-2. The drain line DL2 is grounded, the source line SL2 and the source line SL3 are applied with a source bias voltage +Ve_SL, and the main gate line GL2 and the auxiliary gate line GL2A are applied with the gate bias voltage +Ve_GL. The gate bias voltage +Ve_GL is adjustable according to the positions of the main gate line GL2 and the auxiliary gate line GL2A. The unselected drain lines (e.g., the drain lines DL1 and DL3) are applied with the source bias voltage +Ve_SL. The unselected source lines (e.g., the source lines SL1 and SL4), the unselected main gate lines (e.g., the main gate lines GL1 and GL3), the unselected auxiliary gate lines (e.g., the auxiliary gate lines GL1A and GL3A), and the transistor body are grounded.

Figure 13:
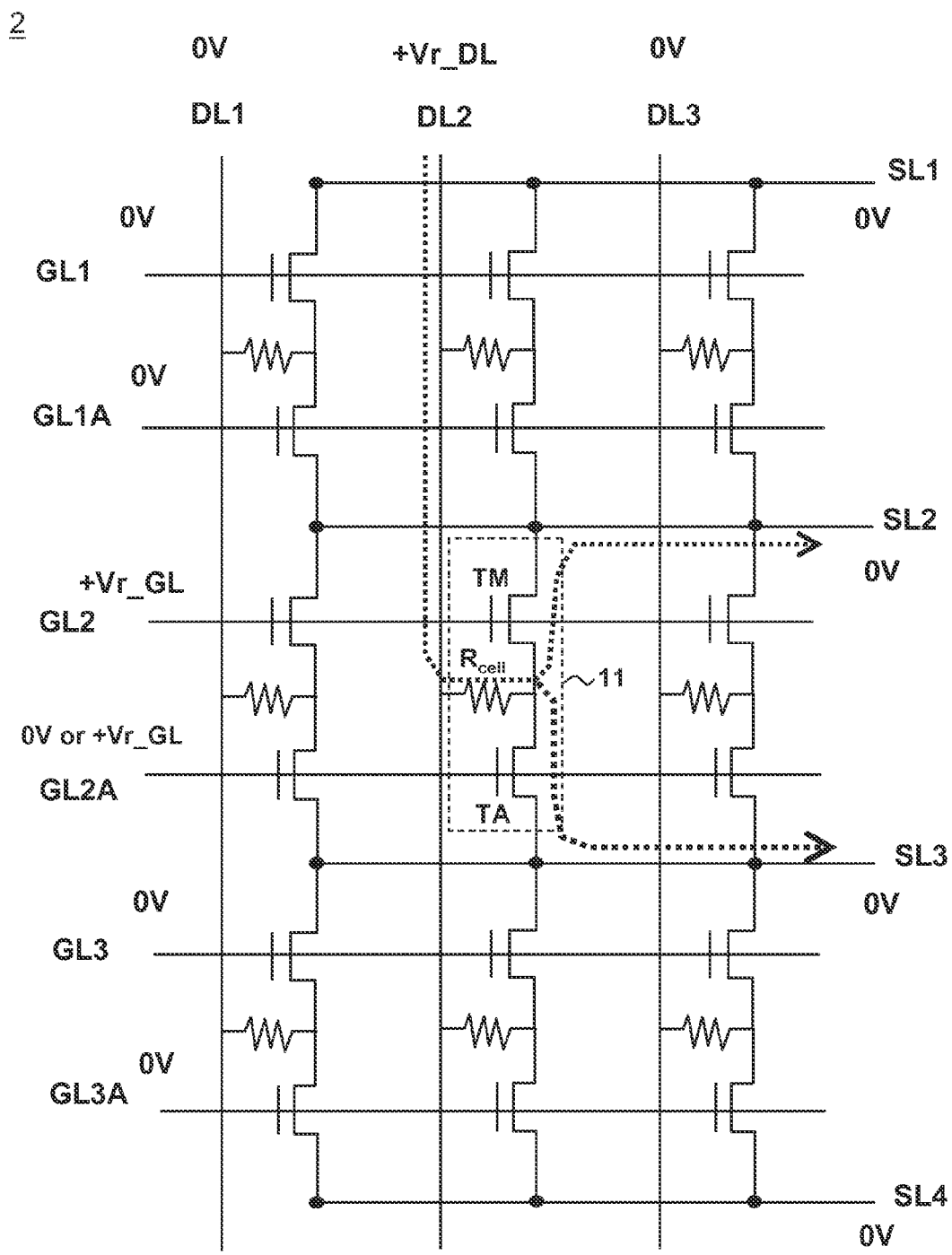
FIG. 13 is a schematic diagram of accessing a resistive memory according to the second embodiment.
Figure 14:
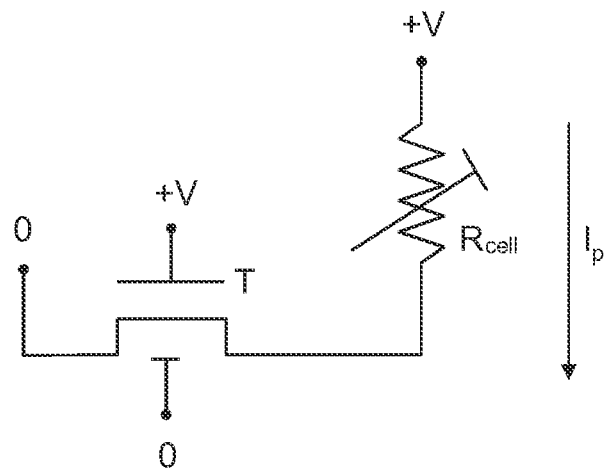
FIG. 14 is a schematic diagram of programming a conventional resistive memory.
Figure 15:
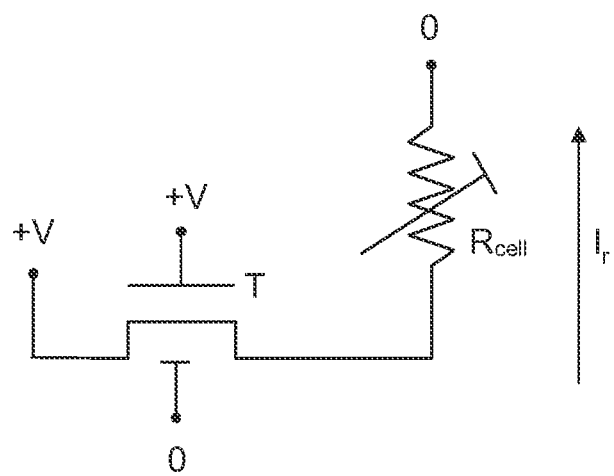
FIG. 15 is a schematic diagram of erasing a conventional resistive memory.

Referring to FIG. 13 and Table-2, FIG. 13 shows a schematic diagram of accessing a resistive memory according to the second embodiment. When the memory unit 11 coupled to the drain line DL2, the source line SL2, the source line SL3, the main gate line GL2 and the auxiliary gate line GL2A is selected, and the resistive memory cell $R_{cell}$ of the selected memory unit 11 is accessed, the drain line DL2, the source line SL2, the source line SL3, the main gate line GL2 and the auxiliary gate line GL2A are as shown in Table-2. The drain line DL2 is applied with a drain bias voltage +Vr_DL, the source line SL2 and the source line SL3 are grounded, the main gate line GL2 is applied with the gate bias voltage +Vr_GL, and the auxiliary gate line GL2A is grounded or applied with the gate bias voltage +Vr_GL. The gate bias voltage +Vr_GL is adjustable according to the position of the main gate line GL2. The unselected drain lines (e.g., the drain lines DL1 and DL3), the unselected source lines (e.g., the source lines SL1 and SL4), the unselected main gate lines (e.g., the main gate lines GL1 and GL3), the unselected auxiliary gate lines (e.g., the auxiliary gate lines GL1A and GL3A), and the transistor body are grounded.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A resistive memory, comprising:
   a resistive memory cell;
   a main transistor;
   an auxiliary transistor;
   a drain line, coupled to the resistive memory cell;
   a main gate line, coupled to a gate of the main transistor; and
   an auxiliary gate line, coupled to a gate of the auxiliary transistor;
   wherein, a drain of the main transistor and a drain of the auxiliary transistor are coupled to one end of the resistive memory cell; when the resistive memory cell is programmed, the main transistor is turned on and the auxiliary transistor is turned off;
   when the resistive memory cell is erased, the main transistor and the auxiliary transistor are turned on.

2. The resistive memory according to claim 1, wherein when the resistive memory cell is accessed, the main transistor is turned on and the auxiliary transistor is turned off.

3. The resistive memory according to claim 1, wherein when the resistive memory cell is accessed, the main transistor and the auxiliary transistor are turned on.

4. The resistive memory according to claim 1, wherein when the main gate line is applied with a gate bias voltage, the gate bias voltage is adjusted according to a position of the main gate line.

5. The resistive memory according to claim 1, further comprising:
   a source line, coupled to a source of the main transistor and a source of the auxiliary transistor.

6. The resistive memory according to claim 5, wherein the drain line is parallel to the source line and is perpendicular to the main gate line and the auxiliary gate line.

7. The resistive memory according to claim 6, wherein when the resistive memory cell is programmed, the drain line is applied with a drain bias voltage, the source line is grounded, the main gate line is applied with a gate bias voltage, and the auxiliary gate line is grounded.

8. The resistive memory according to claim 6, wherein when the resistive memory cell is erased, the drain line is grounded, the source line is applied with a source bias voltage, and the main gate line and the auxiliary gate line are applied with a gate bias voltage.

9. The resistive memory according to claim 6, wherein when the resistive memory cell is accessed, the drain line is applied with a drain bias voltage, the source line is grounded, the main gate line is applied with a gate bias voltage, and the auxiliary gate line is grounded or is applied with the gate bias voltage.

10. The resistive memory according to claim 1, further comprising:
    a first source line, coupled to a source of the main transistor; and
    a second source line, coupled to a source of the auxiliary transistor.

11. The resistive memory according to claim 10, wherein the drain line is perpendicular to the first source line, the second source line, the main gate line and the auxiliary gate line.

12. The resistive memory according to claim 11, wherein when the resistive memory cell is programmed, the drain line is applied with a drain bias voltage, the first source line and the second source line are grounded, the main gate line is applied with a gate bias voltage, and the auxiliary gate line is grounded.

13. The resistive memory according to claim 11, wherein when the resistive memory cell is erased, the source line is grounded, the first source line and the second source line are applied with a source bias voltage, and the main gate line and the auxiliary gate line are applied with a gate bias voltage.

14. The resistive memory according to claim 11, when the resistive memory cell is accessed, the drain line is applied with a drain bias voltage, the first source line and the second source line are grounded, the main gate line is applied with a gate bias voltage, and the auxiliary gate line is grounded or is applied with the gate bias voltage.

15. An operation method of a resistive memory, the resistive memory comprising a resistive memory cell, a main transistor and an auxiliary transistor, the operation method comprising:
    when the resistive memory cell is programmed, turning on the main transistor coupled to the resistive memory cell, and turning off the auxiliary transistor coupled to the resistive memory cell and the main transistor; and
    when the resistive memory cell is erased, turning on the main transistor and the auxiliary transistor;
    wherein the resistive memory further comprises:
    a drain line, coupled to the resistive memory cell;
    a main gate line, coupled to a gate of the main transistor; and
    an auxiliary gate line, coupled to a gate of the auxiliary transistor.

16. The operation method according to claim 15, wherein when the resistive memory cell is accessed, the main transistor is turned on and the auxiliary transistor is turned off.

17. The operation method according to claim 15, wherein when the resistive memory cell is accessed, the main transistor and the auxiliary transistor are turned on.

18. The operation method according to claim 17, wherein when the main gate line is applied with a gate bias voltage, the gate bias voltage changes according to a position of the main gate line.

* * * * *